(12) United States Patent
Chen et al.

(10) Patent No.: US 10,827,642 B2
(45) Date of Patent: Nov. 3, 2020

(54) RACK SYSTEM AND CABLE SUPPORTING ASSEMBLY THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/142,365

(22) Filed: Sep. 26, 2018

(65) Prior Publication Data
US 2019/0323629 A1 Oct. 24, 2019

(30) Foreign Application Priority Data
Apr. 20, 2018 (TW) ............................. 107113773 A

(51) Int. Cl.
*H05K 7/14* (2006.01)
*F16L 3/015* (2006.01)
*H05K 7/18* (2006.01)

(52) U.S. Cl.
CPC ............ *H05K 7/1491* (2013.01); *F16L 3/015* (2013.01); *H05K 7/183* (2013.01)

(58) Field of Classification Search
CPC ..... F16L 3/015; H05K 5/0247; H05K 7/1491; H05K 7/183
See application file for complete search history.

(56) References Cited

U.S. PATENT DOCUMENTS

| | | | | |
|---|---|---|---|---|
| 5,169,221 A * | 12/1992 | Wheeler | ................... | H05K 7/16 16/358 |
| 6,497,465 B1 * | 12/2002 | Baker | ................... | H05K 7/1421 312/223.1 |
| 7,097,047 B2 * | 8/2006 | Lee | ....................... | H05K 7/1449 211/26.2 |
| 7,510,421 B2 * | 3/2009 | Fransen | ............... | H01R 9/2416 439/449 |
| 7,540,806 B2 * | 6/2009 | Tastad | ..................... | A63F 13/08 16/324 |

(Continued)

FOREIGN PATENT DOCUMENTS

JP 3187607 U 12/2013

*Primary Examiner* — Stanton L Krycinski
(74) *Attorney, Agent, or Firm* — Rosenberg, Klein & Lee

(57) ABSTRACT

A cable supporting assembly for use in a rack system includes a connecting device, a cable supporting member, a first mechanism, and a second mechanism. The cable supporting member is movably mounted on the connecting device. The first mechanism is arranged at one of the connecting device and the cable supporting member, and the second mechanism, at the other. The first mechanism and the second mechanism can connect with each other to keep the cable supporting member at a predetermined position with respect to the connecting device. The cable supporting member can be moved to a first position or a second position with respect to the connecting device when the first mechanism and the second mechanism are not connected with each other.

18 Claims, 6 Drawing Sheets

(56) References Cited

U.S. PATENT DOCUMENTS

| | | | |
|---|---|---|---|
| 7,762,411 B2* | 7/2010 | Hilburn | H05K 7/1489 211/192 |
| 8,371,454 B2* | 2/2013 | Chen | H05K 7/1421 211/26 |
| 8,701,902 B2* | 4/2014 | Oura | H05K 7/1421 211/192 |
| 8,730,678 B1 | 5/2014 | Cunningham et al. | |
| 8,931,742 B2* | 1/2015 | Gong | H05K 7/1491 248/49 |
| 9,038,832 B2* | 5/2015 | Hernandez-Ariguznaga | H05K 7/16 211/26 |
| 9,144,174 B2* | 9/2015 | Chen | H05K 7/1421 |
| 9,161,625 B2 | 10/2015 | Chen et al. | |
| 9,281,676 B2* | 3/2016 | Chen | H05K 7/1491 |
| 9,383,038 B2* | 7/2016 | Chen | F16L 3/015 |
| 9,769,947 B1* | 9/2017 | Sands | H05K 7/1491 |
| 9,888,603 B1* | 2/2018 | Vargas | H05K 7/14 |
| 9,913,398 B1* | 3/2018 | Chen | H02G 3/32 |
| 10,076,054 B2* | 9/2018 | Goergen | H05K 7/1491 |
| 10,292,301 B1* | 5/2019 | Chen | H05K 7/183 |
| 2004/0035983 A1* | 2/2004 | Simonson | H02G 15/007 248/49 |
| 2013/0134115 A1* | 5/2013 | Hernandez-Ariguznaga | H05K 7/186 211/26 |
| 2013/0301225 A1* | 11/2013 | Gong | H05K 7/1491 361/729 |
| 2014/0097000 A1* | 4/2014 | Lin | H02G 11/00 174/135 |
| 2015/0103488 A1* | 4/2015 | Tanaka | H05K 7/1491 361/679.58 |
| 2015/0230355 A1 | 8/2015 | George et al. | |
| 2017/0223860 A1* | 8/2017 | Jones | H05K 7/1491 |

* cited by examiner

RACK SYSTEM AND CABLE SUPPORTING ASSEMBLY THEREOF

FIELD OF THE INVENTION

The present invention relates to a rack system and more particularly to a cable supporting assembly for storing cables extending from the chassis of a piece of electronic equipment.

BACKGROUND OF THE INVENTION

U.S. Pat. No. 7,097,047 B2 discloses a cable management flip tray assembly. According to the specification of this US patent and its FIG. 1 and FIG. 2, a rack (10) includes a plurality of posts (11), and an information handling system (14) is mounted on the rack (10). The cable management flip tray assembly (100) includes a mounting bracket (110) and a flip tray (160). The mounting bracket (110) is mounted on the posts (11). The flip tray (160) is movably mounted on the mounting bracket (110) and can assume a first (or vertical) position with respect to the mounting bracket (110), as shown in the aforesaid FIG. 1, or a second position with respect to the mounting bracket (110), as shown in the aforesaid FIG. 2. More specifically, it is the L-shaped slots (138, 140) on the two lateral sides of the mounting bracket (110), the L-shaped slots (166, 167) on the two lateral sides of the flip tray (160), and the two corresponding pins (192) that enable the flip tray (160) to be moved to either the first or the second position with respect to the mounting bracket (110).

However, it is not always desirable to move a cable supporting member along L-shaped slots. Different kinds of products need to be developed to satisfy different market demands.

SUMMARY OF THE INVENTION

The present invention relates to a cable supporting assembly in which a cable supporting member can assume at least two positions with respect to a connecting device.

According to one aspect of the present invention, a cable supporting assembly includes a connecting device, a cable supporting member, a first mechanism, and a second mechanism. The cable supporting member is movably mounted on the connecting device. The first mechanism is arranged at one of the connecting device and the cable supporting member while the second mechanism is arranged at the other of the connecting device and the cable supporting member. The first mechanism and the second mechanism can connect with each other to retain the cable supporting member at a predetermined position with respect to the connecting device. As long as the first mechanism and the second mechanism are not connected with each other, the cable supporting member can leave the predetermined position and be moved to a first position or a second position with respect to the connecting device.

Preferably, the connecting device includes a pair of connecting members, and the cable supporting member is movably mounted between the pair of connecting members.

Preferably, the cable supporting member has two end portions, and two shafts are used to rotatably connect the two end portions to the pair of connecting members respectively.

Preferably, a rod-like body is arranged between the two end portions of the cable supporting member and is substantially perpendicular to the two end portions.

Preferably, one of the first mechanism and the second mechanism includes a plurality of connecting features that are arranged at one of the connecting members at positions around and adjacent to the corresponding shaft, and the other of the first mechanism and the second mechanism includes a connecting portion to be connected with either one of the connecting features in order to retain the cable supporting member at the corresponding one of the predetermined position, the first position, and the second position with respect to the connecting device.

Preferably, the first position and the second position are opposite positions, and the connecting device is provided with a position-limiting feature for preventing the cable supporting member from being rotated from the first position to the second position in a first direction with respect to the connecting device or from the second position to the first position in a second direction with respect to the connecting device.

Preferably, the other of the first mechanism and the second mechanism includes a base, and the connecting portion is movably mounted on the base and can connect with either one of the connecting features when at a mounting position.

Preferably, the cable supporting member has, between its two end portions, a first wall, a second wall, and a third wall connected between the first wall and the second wall. The first wall, the second wall, and the third wall jointly define a channel.

According to another aspect of the present invention, a rack system includes a rack, a first slide rail assembly, a second slide rail assembly, and the cable supporting assembly according to any of the foregoing embodiments. The first slide rail assembly and the second slide rail assembly are mounted on a first side and a second side of the rack respectively and are configured to carry an object. The connecting device of the cable supporting assembly is mountable with the object, and the cable supporting member of the cable supporting assembly is operable to leave the predetermined position and be moved to a first position or a second position with respect to the connecting device.

Preferably, the pair of connecting members of the connecting device are mountable with a pair of mounting members of the object respectively.

Preferably, the pair of connecting members of the connecting device are detachably mountable with the pair of mounting members of the object respectively.

Preferably, the object includes an upper space and a lower space. The upper space and the lower space are configured to accommodate an upper-tier article and a lower-tier article respectively such that the lower-tier article can be pulled out of the lower space when the cable supporting member is at the first position and the upper-tier article can be pulled out of the upper space when the cable supporting member is at the second position.

DETAILED DESCRIPTION OF THE INVENTION

Figure 1:
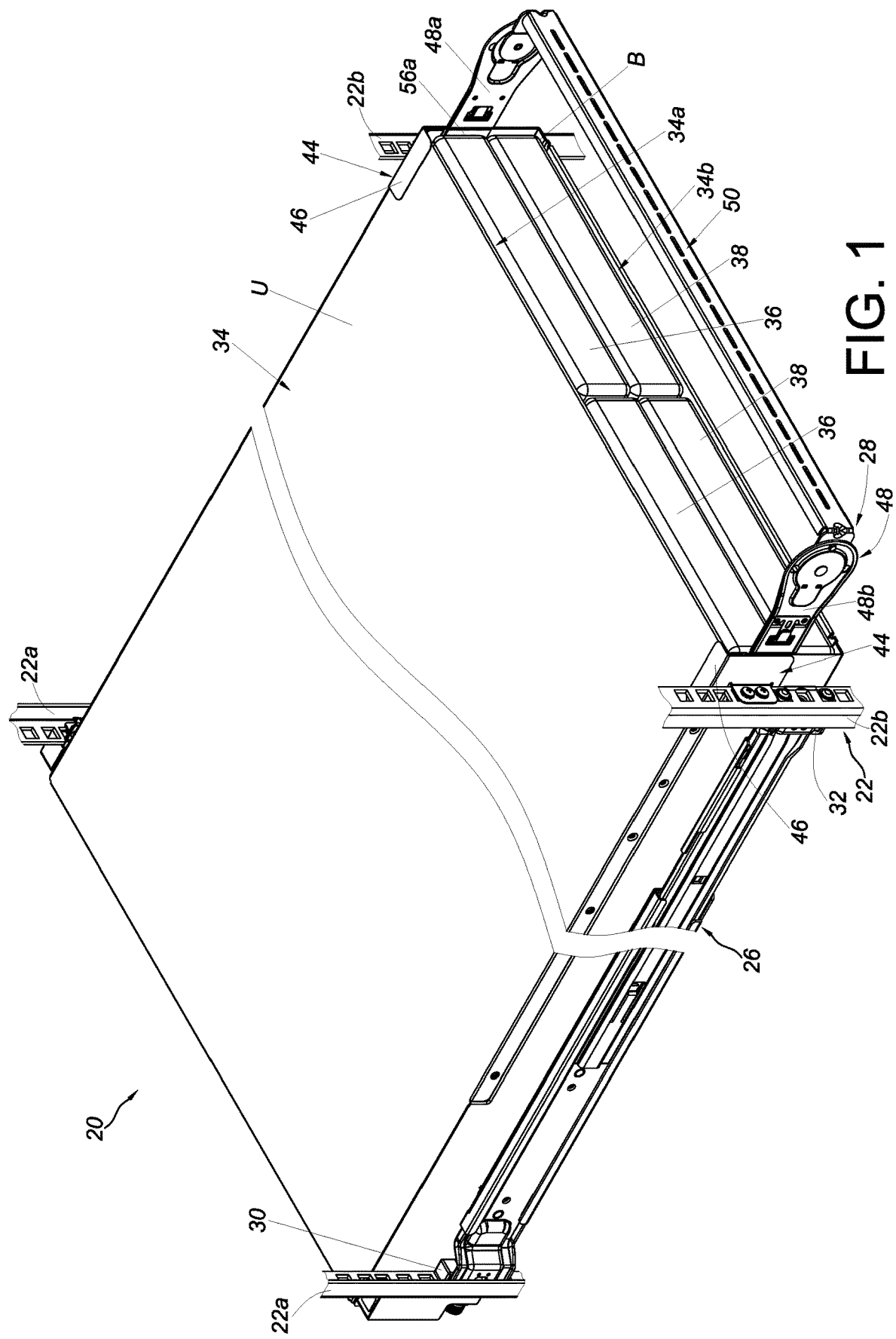
FIG. 1 is a perspective view of the rack system according to an embodiment of the present invention.
Figure 2:
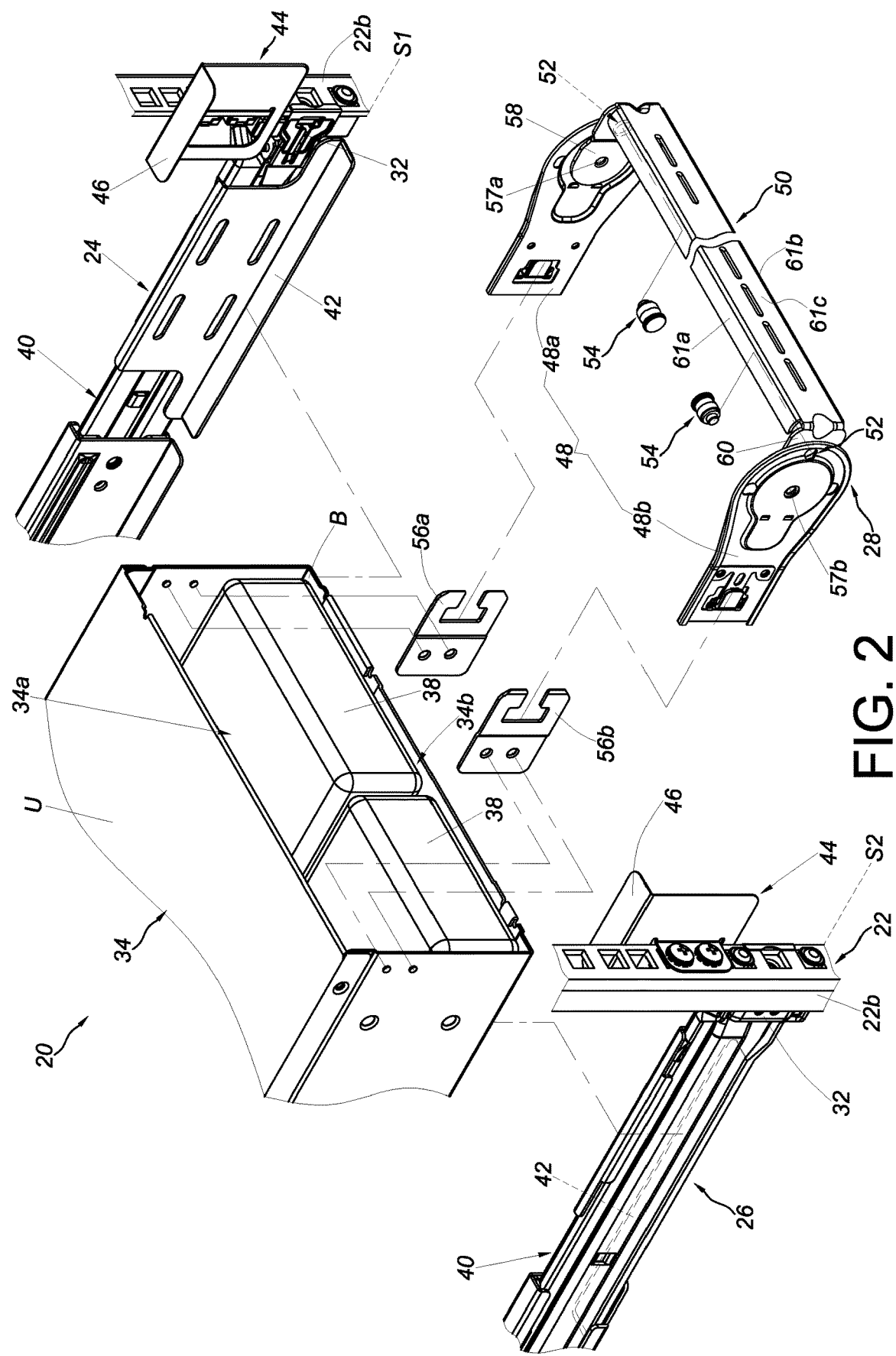
FIG. 2 is a partial exploded perspective view of the rack system according to an embodiment of the present invention.

As shown in FIG. 1 and FIG. 2, the rack system 20 according to an embodiment of the present invention includes a rack 22, a first slide rail assembly 24, a second slide rail assembly 26, and a cable supporting assembly 28. The first slide rail assembly 24 in FIG. 1 is hidden from sight due to the viewing angle of the drawing.

The rack 22 includes a pair of first posts 22a (e.g., front posts) and a pair of second posts 22b (e.g., rear posts). The first slide rail assembly 24 and the second slide rail assembly 26 are mounted on a first side S1 and a second side S2 of the rack 22 respectively. More specifically, each of the first slide rail assembly 24 and the second slide rail assembly 26 includes a first bracket 30 to be mounted on the corresponding first post 22a and a second bracket 32 to be mounted on the corresponding second post 22b. The method by which the brackets are respectively mounted to the posts is well known to a person skilled in the art and, for the sake of brevity therefore, will not be described in more detail.

Preferably, the first slide rail assembly 24 and the second slide rail assembly 26 are configured to carry an object 34. Here, the object 34 is a piece of electronic equipment by way of example and includes an upper space 34a and a lower space 34b. The upper space 34a and the lower space 34b are configured to accommodate an upper-tier article 36 and a lower-tier article 38 respectively. Preferably, each of the first slide rail assembly 24 and the second slide rail assembly 26 includes a slide rail 40, which includes a supporting portion 42 for supporting a bottom portion B of the object 34. Preferably, the rack system 20 further includes a fitting 44 detachably mounted on one of the second posts 22b of the rack 22. Here, by way of example, two fittings 44 are mounted respectively on the second posts 22b by threaded connection, and each fitting 44 has an extension portion 46 extending to a position corresponding to a top portion U of the object 34, thereby preventing the object 34 from tilting upward with respect to the supporting portions 42 of the first slide rail assembly 24 and of the second slide rail assembly 26.

The cable supporting assembly 28 includes a connecting device 48, a cable supporting member 50, a first mechanism 52, and a second mechanism 54. The connecting device 48 is configured to be mounted to the object 34. Preferably, the connecting device 48 includes a pair of connecting members, such as a first connecting member 48a and a second connecting member 48b. Preferably, the first connecting member 48a and the second connecting member 48b are configured to be mounted in a detachable manner on a first mounting member 56a and a second mounting member 56b at the rear of the object 34 respectively. Preferably, the cable supporting member 50 is movably mounted between the first connecting member 48a and the second connecting member 48b of the connecting device 48.

As shown in FIG. 2, the cable supporting member 50 has two end portions, such as a first end portion 58 and a second end portion 60. The first end portion 58 is rotatably connected to the first connecting member 48a via a first shaft 57a, and the second end portion 60 is rotatably connected to the second connecting member 48b via a second shaft 57b.

Figure 3:
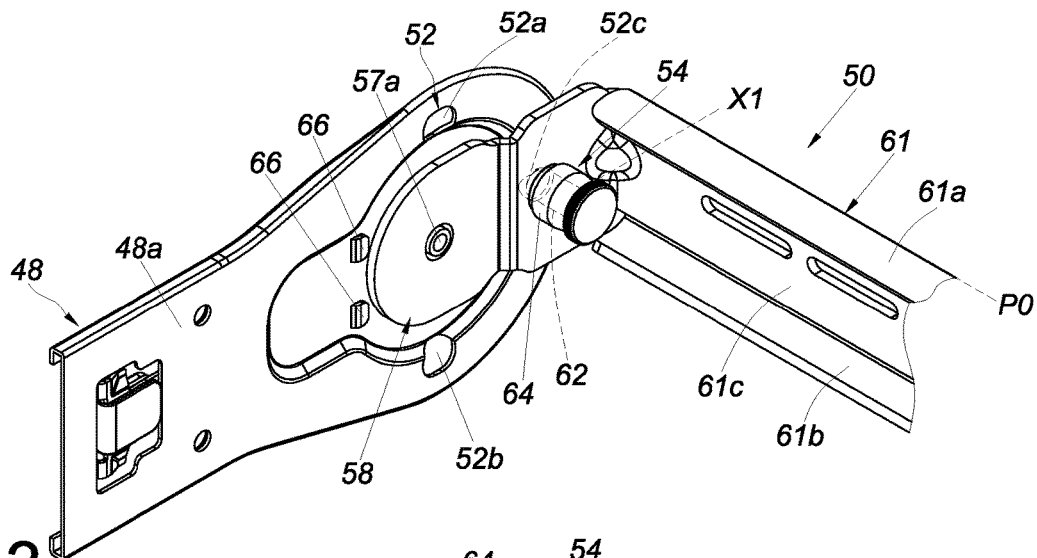
FIG. 3 is a schematic view showing that the cable supporting member of the cable supporting assembly according to an embodiment of the present invention is at a predetermined position with respect to the connecting device.

As shown in FIG. 2 and FIG. 3, the cable supporting member 50 includes a rod-like body 61 arranged between the first end portion 58 and the second end portion 60. The rod-like body 61 is substantially perpendicularly connected to the first end portion 58 and the second end portion 60. Preferably, the rod-like body 61 of the cable supporting member 50 has a first wall 61a, a second wall 61b, and a third wall 61c connected between the first wall 61a and the second wall 61b, and the first wall 61a and the second wall 61b are bent with respect to the third wall 61c. The first wall 61a, the second wall 61b, and the third wall 61c jointly define a channel for storing cables for example.

The first mechanism 52 is arranged at one of the connecting device 48 and the cable supporting member 50, and the second mechanism 54 is arranged at the other of the connecting device 48 and the cable supporting member 50. Here, by way of example, the first mechanism 52 is arranged at the second connecting member 48b as well as the first connecting member 48a of the connecting device 48, and the second mechanism 54 is arranged at the second end portion 60 as well as the first end portion 58 of the cable supporting member 50; in practice, the first and the second mechanisms are not necessarily so arranged. As the first connecting member 48a and the second connecting member 48b of the connecting device 48 have substantially the same structural configuration, and so do the first end portion 58 and the second end portion 60 of the cable supporting member 50, FIG. 3 shows only the first mechanism 52 at the first connecting member 48a of the connecting device 48 and the second mechanism 54 at the first end portion 58 of the cable supporting member 50 for the sake of simplicity.

Figure 4:
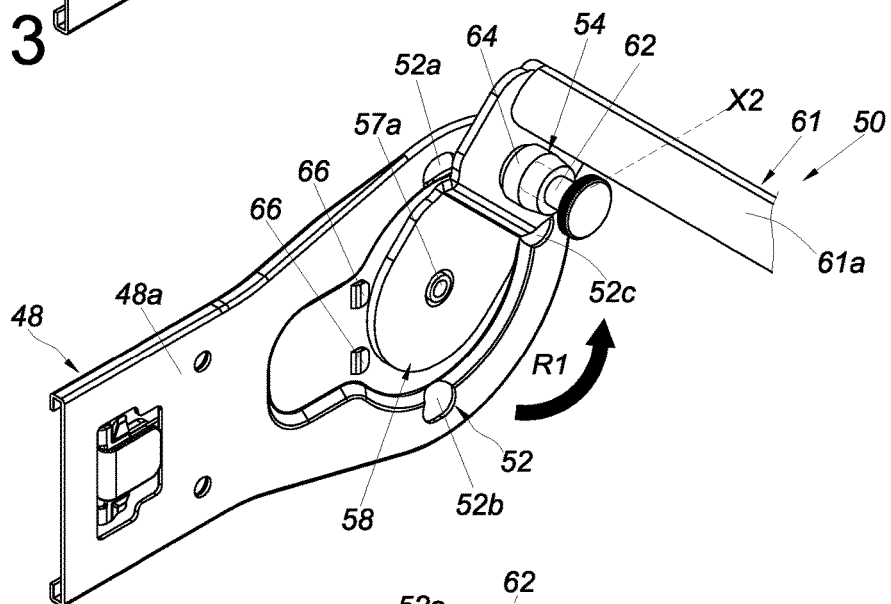
FIG. 4 is a schematic view showing that the cable supporting member of the cable supporting assembly according to an embodiment of the present invention is rotated in a certain direction with respect to the connecting device.

Referring to FIG. 3 and FIG. 4, the first mechanism 52 includes a plurality of connecting features, such as a first connecting feature 52a, a second connecting feature 52b, and a third connecting feature 52c. The connecting features 52a, 52b, and 52c are arranged at the first connecting member 48a and are adjacent to and distributed around the corresponding shaft (e.g., the first shaft 57a). Here, the connecting features 52a, 52b, and 52c are holes or grooves, but they are not necessarily so in practice. The second mechanism 54 includes a connecting portion 62 for connecting with either one of the connecting features. Preferably, the second mechanism 54 further includes a base 64, and the connecting portion 62 is movably mounted on the base 64. The connecting portion 62 of the second mechanism 54 may connect with the connecting features 52a, 52b, and 52c by means of insertion, engagement, or screw threads; the present invention has no limitation in this regard. The connecting portion 62 can connect with either one of the connecting features 52a, 52b, and 52c when at a mounting position X1 with respect to the base 64, and is unable to connect with any of the connecting features 52a, 52b, and 52c when at a non-mounting position X2 with respect to the base 64 (i.e., when away from the mounting position X1).

The first mechanism 52 and the second mechanism 54 are designed to connect with each other and thereby keep the cable supporting member 50 at predetermined positions with respect to the connecting device 48. More specifically, when the connecting portion 62 of the second mechanism 54 is at the mounting position X1 and connected with the third connecting feature 52c of the first mechanism 52, the cable supporting member 50 is retained at a predetermined position P0 with respect to the connecting device 48 (as shown in FIG. 3). When subsequently moved to the non-mounting position X2, the connecting portion 62 is disconnected from the third connecting feature 52c (as shown in FIG. 4) so that the cable supporting member 50 can be operated, or rotated in a first direction R1 with respect to the connecting device 48 to be exact, until a first position P1 is reached (as shown in FIG. 5).

Figure 5:
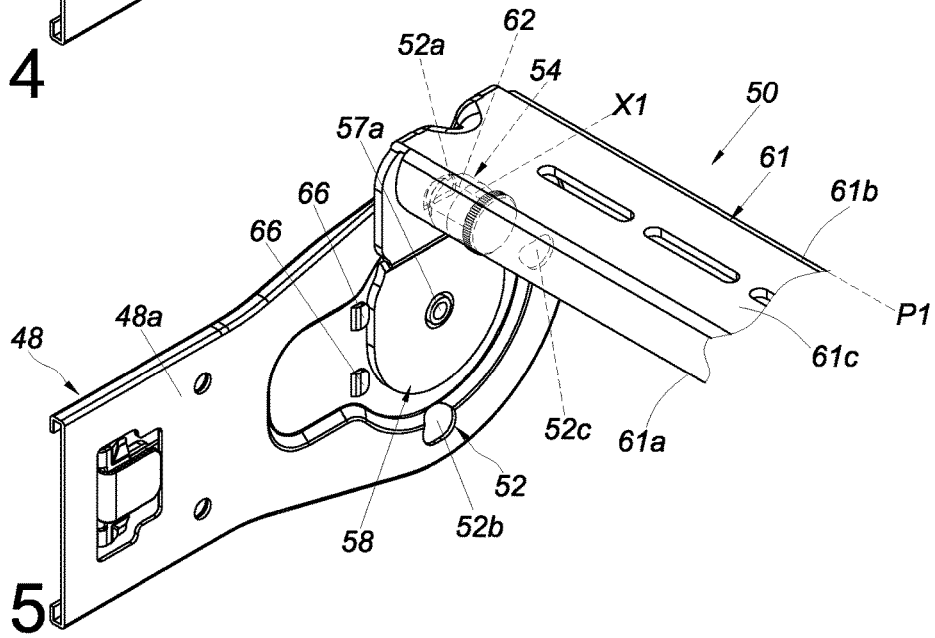
FIG. 5 is a schematic view showing that the cable supporting member of the cable supporting assembly according to an embodiment of the present invention reaches a first position with respect to the connecting device.

When the cable supporting member 50 is at the first position P1 as shown in FIG. 5, the first mechanism 52 and the second mechanism 54 are connectable once more to keep the cable supporting member 50 at the first position P1 with respect to the connecting device 48. More specifically, when the connecting portion 62 of the second mechanism 54 is at the mounting position X1 and connected with the first connecting feature 52a of the first mechanism 52, the cable supporting member 50 is retained at the first position P1 with respect to the connecting device 48.

Figure 6:
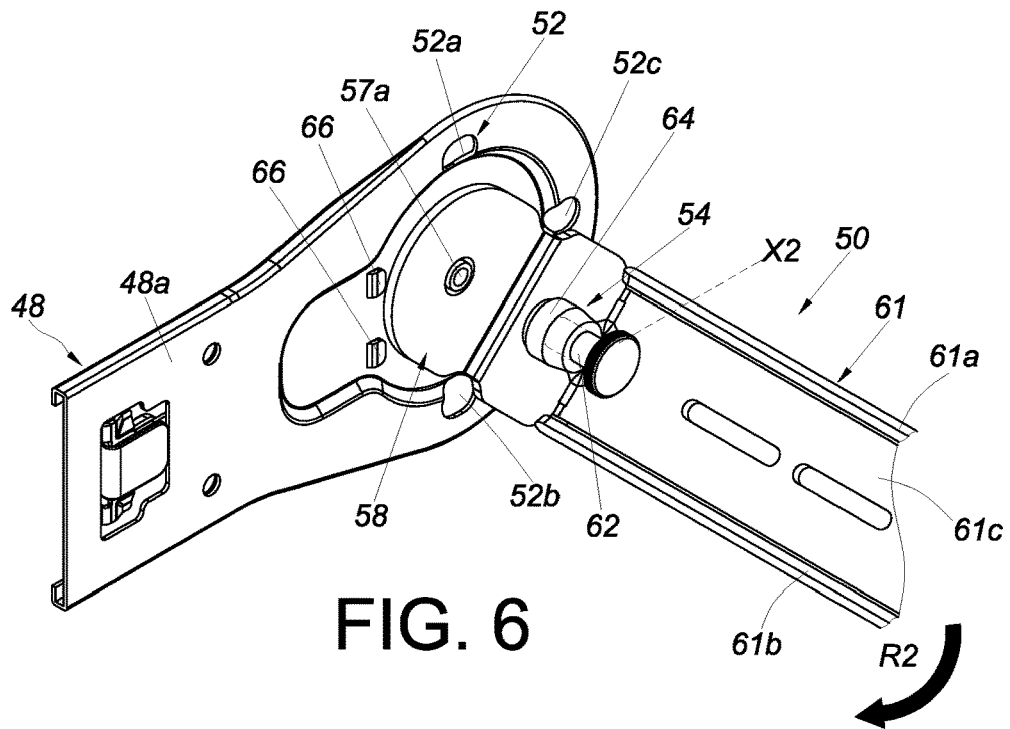
FIG. 6 is a schematic view showing that the cable supporting member of the cable supporting assembly according to an embodiment of the present invention is rotated in another direction with respect to the connecting device.
Figure 7:
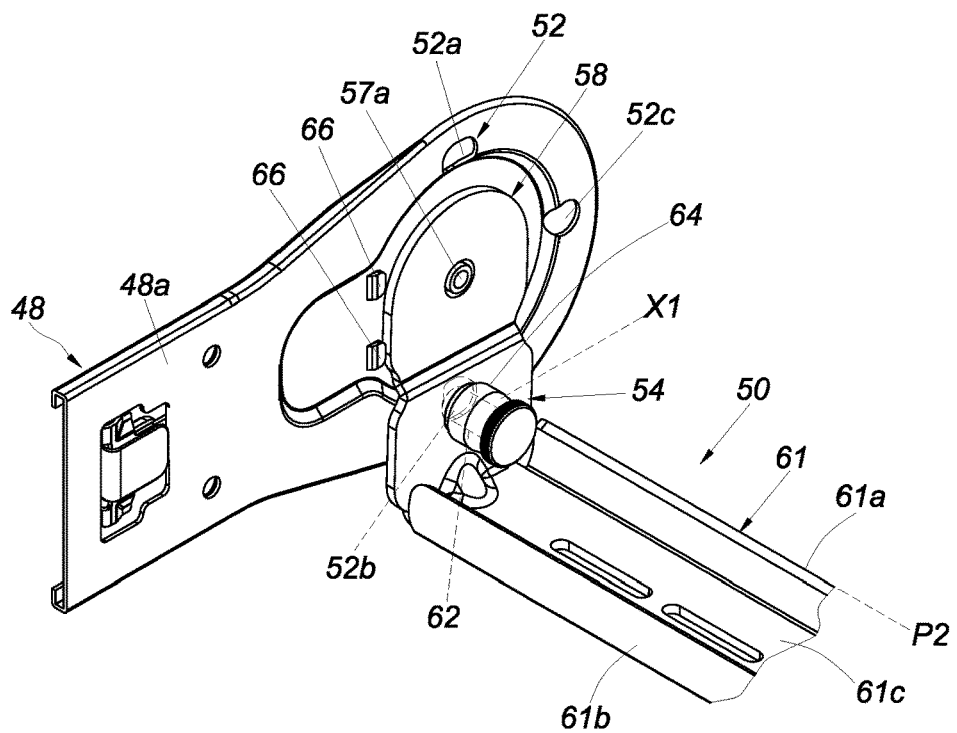
FIG. 7 is a schematic view showing that the cable supporting member of the cable supporting assembly according to an embodiment of the present invention reaches a second position with respect to the connecting device.

Referring to FIG. 6 and FIG. 7, by moving the connecting portion 62 of the second mechanism 54 to the non-mounting position X2 again, the connecting portion 62 of the second mechanism 54 is disconnected from the first connecting feature 52a of the first mechanism 52, and the cable supporting member 50, therefore, can be operated, or rotated in a second direction R2 with respect to the connecting device 48 to be exact, until a second position P2 is reached. When the cable supporting member 50 is at the second position P2, the first mechanism 52 and the second mechanism 54 are connectable to keep the cable supporting member 50 at the second position P2 with respect to the connecting device 48. More specifically, when the connecting portion 62 of the second mechanism 54 is at the mounting portion X1 and connected with the second connecting feature 52b of the first mechanism 52, the cable supporting member 50 is retained at the second position P2 with respect to the connecting device 48.

Preferably, the second position P2 and the first position P1 are opposite positions, i.e., 180 degrees apart from each other. For example, when the cable supporting member 50 is at the second position P2, the rod-like body 61 of the cable supporting member 50 lies below the connecting device 48 (as shown in FIG. 7); and when the cable supporting member 50 is at the first position P1, the rod-like body 61 of the cable supporting member 50 lies above the connecting device 48 (as shown in FIG. 5). Preferably, the predetermined position P0 is located between the first position P1 and the second position P2; for example; the predetermined position P0 is 90 degrees apart from each of the first position P1 and the second position P2 (see FIG. 3, FIG. 5, and FIG. 7).

Figure 8:
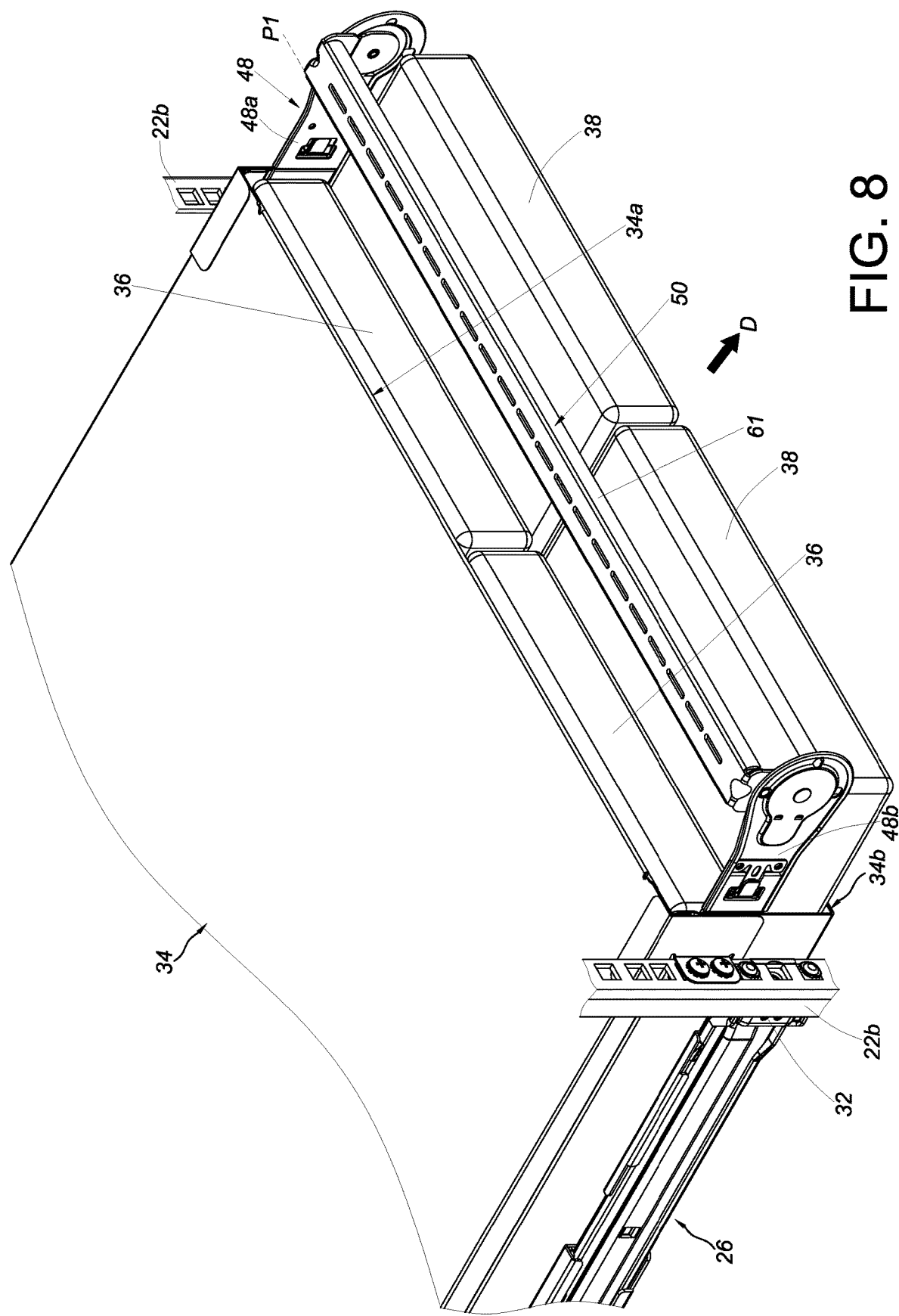
FIG. 8 is a schematic view showing that the cable supporting member of the rack system according to an embodiment of the present invention is at the first position so that a lower-tier article in the object carried by the rack system can be pulled out.

Preferably, the connecting device 48 is provided with at least one position-limiting feature 66, e.g., projection. While the second mechanism 54 is not connected with the first mechanism 52, the position-limiting feature 66 can prevent the cable supporting member 50 from rotation with respect to the connecting device 48 from the first position P1 to the second position P2 in the first direction R1 or from the second position P2 to the first position P1 in the second direction R2. This arrangement prevents the cable supporting member 50 from being moved with respect to the connecting device 48 to an improper position where the cable supporting member 50 may occupy the space immediately behind the object 34. Referring to FIG. 8, the upper space 34a of the object 34 accommodates the upper-tier article 36, and the lower space 34b of the object 34 accommodates the lower-tier article 38. When the cable supporting member 50 is at the first position P1 with respect to the first connecting member 48a and the second connecting member 48b of the connecting device 48, the rod-like body 61 of the cable supporting member 50 does not interfere with the moving path of the lower-tier article 38, so the lower-tier article 38 can be pulled out of the lower space 34b of the object 34 in a predetermined direction D.

Figure 9:
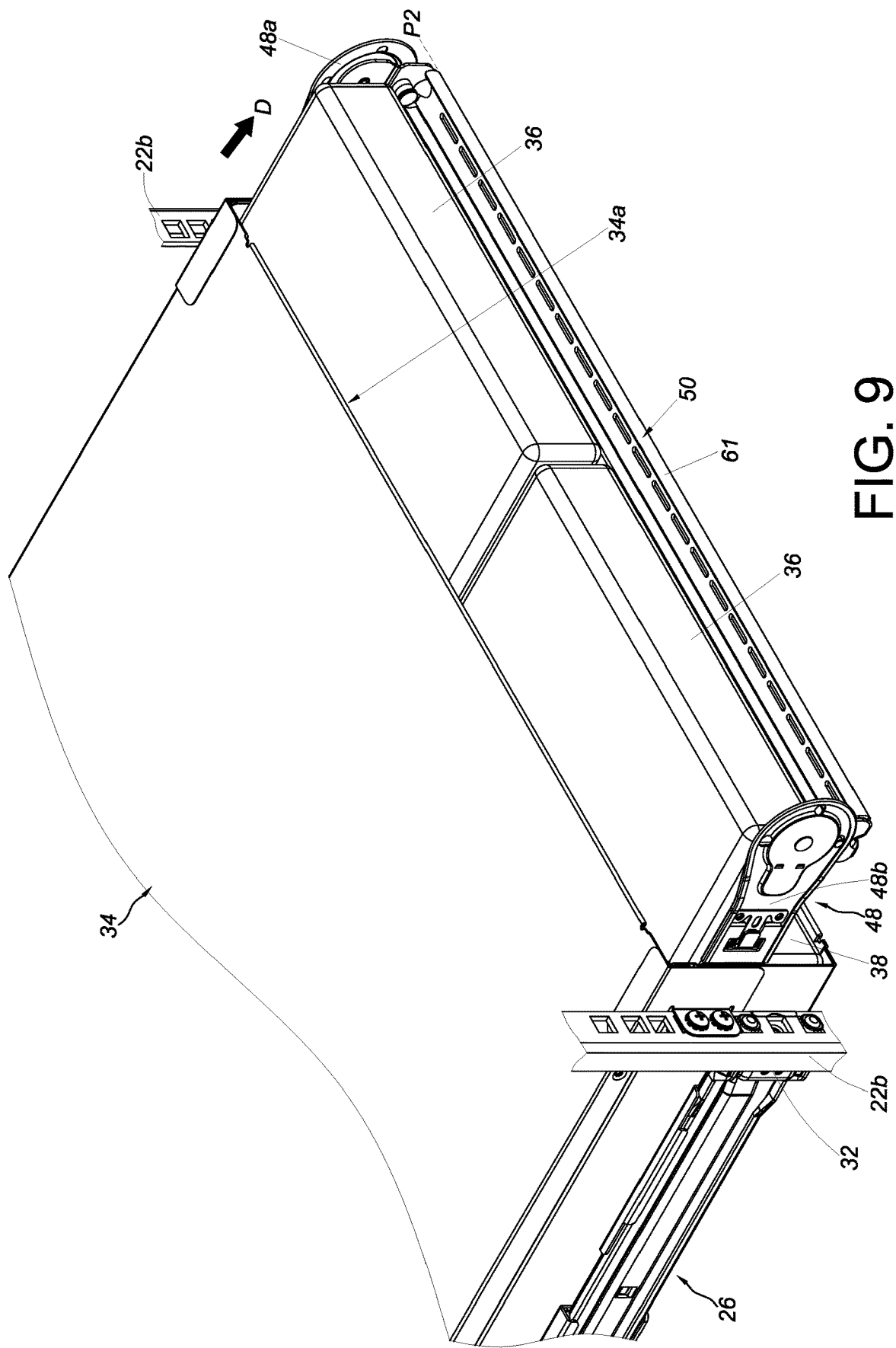
FIG. 9 is a schematic view showing that the cable supporting member of the rack system according to an embodiment of the present invention is at the second position instead, allowing an upper-tier article in the object to be pulled out.

Similarly, referring to FIG. 9, when the cable supporting member 50 is at the second position P2 with respect to the first connecting member 48a and the second connecting member 48b of the connecting device 48, the rod-like body 61 of the cable supporting member 50 does not interfere with the moving path of the upper-tier article 36, so the upper-tier article 36 can be pulled out of the upper space 34a of the object 34 in the predetermined direction D.

Referring back to FIG. 1, when the cable supporting member 50 is at the predetermined position P0 with respect to the first connecting member 48a and the second connecting member 48b of the connecting device 48, the rod-like body 61 of the cable supporting member 50 blocks the moving paths of both the upper-tier article 36 and the lower-tier article 38; as a result, neither the upper-tier article 36 nor the lower-tier article 38 can be pulled out in the predetermined direction D. Under normal conditions, therefore, the cable supporting member 50 is at the predetermined position P0 with respect to the first connecting member 48a and the second connecting member 48b of the connecting device 48.

According to the above, the rack system disclosed herein and its cable supporting assembly preferably have the following features:

1. The cable supporting member 50 can assume at least two positions (e.g., the predetermined position P0, the first position P1, and the second position P2) with respect to the connecting device 48 to facilitate on-site maintenance of the object 34 and the articles accommodated therein (e.g., the upper-tier article 36 and the lower-tier article 38).
2. Certain articles in the object 34 can be pulled out for maintenance when the cable supporting member 50 is at the first position P1 or the second position P2.
3. The slide rail 40 of the slide rail assembly has the supporting portion 42 for supporting the bottom portion B of the object 34.
4. The fitting 44 of the rack system is detachably mounted on the corresponding post of the rack 22, and the extension portion 46 of the fitting 44 extends to a position adjacent to the top portion U of the object 34 to keep the object 34 from tilting upward with respect to the supporting portion 42 of the slide rail assembly.

5. The at least one position-limiting feature 66 of the connecting device 48 prevents the cable supporting member 50 from being moved to an improper position with respect to the connecting device 48, lest the cable supporting member 50 occupy the space immediately behind the object 34.

While the present invention has been disclosed through the preferred embodiment described above, it should be understood that the embodiment is not intended to be restrictive of the scope of the invention. The scope of patent protection sought by the applicant is defined by the appended claims.

What is claimed is:

1. A cable supporting assembly, comprising:
a connecting device including a pair of connecting members disposed to define an open space therebetween;
a cable supporting member having two end portions and a body portion extending intermediately therebetween, the end portions being rotatably mounted on the connecting members of the connecting device for selective displacement between a plurality of selectable positions, the body portion remaining outside the open space defined between the connecting members at each of the selectable positions;
a first mechanism integrally formed with one of the connecting device and the cable supporting member; and
a second mechanism arranged at the other of the connecting device and the cable supporting member;
wherein the first mechanism and the second mechanism are connectable with each other to releasably lock the cable supporting member at a selected one of the selectable positions with respect to the connecting device; and
wherein, when the first mechanism and the second mechanism are not connected with each other, the cable supporting member is movable in angular position between the selectable positions with respect to the connecting device, the cable supporting member thereby rotating relative to the connecting device.

2. The cable supporting assembly of claim 1, wherein the two end portions of the cable supporting member are rotatably mounted between the pair of connecting members.

3. The cable supporting assembly of claim 2, wherein the two end portions are each rotatably connected to a corresponding one of the pair of connecting members via a shaft.

4. The cable supporting assembly of claim 3, wherein the first mechanism includes a plurality of connecting features, the connecting features are integrally formed with one of the connecting members at positions around and adjacent to a corresponding one of the shafts, and the second mechanism includes a connecting portion for connecting with any one of the connecting features to thereby releasably lock the cable supporting member at a corresponding one of the selectable positions with respect to the connecting device.

5. The cable supporting assembly of claim 4, wherein the selectable positions include a predetermined position, a first position, and a second position, wherein the first position and the second position are opposite positions relative to the predetermined position, and the connecting device is provided with a position-limiting feature for preventing the cable supporting member from rotation from the first position to the second position in a first direction with respect to the connecting device, and for preventing the cable supporting member from rotation from the second position to the first position in a second direction with respect to the connecting device.

6. The cable supporting assembly of claim 4, wherein the second mechanism includes a base, the connecting portion is movably mounted on the base, and the connecting portion is connectable with any one of the connecting features when at a mounting position.

7. The cable supporting assembly of claim 3, wherein the body portion of the cable supporting member includes a first wall, a second wall, and a third wall connected between the first wall and the second wall; and the first wall, the second wall, and the third wall jointly define a channel.

8. A rack system, comprising:
a rack;
a first slide rail assembly and a second slide rail assembly mounted respectively on a first side and a second side of the rack and configured to carry an object; and
a cable supporting assembly including:
a connecting device configured to be mounted to the object, the connecting device including a pair of connecting members disposed to define an open space therebetween;
a cable supporting member having two end portions and a body portion extending intermediately therebetween, the end portions being rotatably mounted on the connecting members of the connecting device for selective displacement between a plurality of selectable positions, the body portion remaining outside the open space defined between the connecting members at each of the selectable positions;
a first mechanism integrally formed with one of the connecting device and the cable supporting member; and
a second mechanism arranged at the other of the connecting device and the cable supporting member;
wherein the first mechanism and the second mechanism are connectable with each other to releasably lock the cable supporting member at a selected one of the selectable positions with respect to the connecting device; and
wherein, when the first mechanism and the second mechanism are not connected with each other, the cable supporting member is movable in angular position between the selectable positions with respect to the connecting device, the cable supporting member thereby rotating relative to the connecting device.

9. The rack system of claim 8, wherein the pair of connecting members are mounted respectively to a pair of mounting members of the object, and the end portions of the cable supporting member are rotatably mounted between the pair of connecting members.

10. The rack system of claim 9, wherein the pair of connecting members are configured to be mounted in a detachable manner to the pair of mounting members of the object respectively.

11. The rack system of claim 9, wherein the two end portions are each rotatably connected to a corresponding one of the pair of connecting members via a shaft.

12. The rack system of claim 11, wherein the first mechanism includes a plurality of connecting features, the connecting features are integrally formed with one of the connecting members at positions around and adjacent to a corresponding one of the shafts, and the second mechanism includes a connecting portion for connecting with any one of the connecting features to thereby releasably lock the cable supporting member at a corresponding one of the selectable positions with respect to the connecting device.

13. The rack system of claim 12, wherein the selectable positions include a predetermined position, a first position, and a second position, wherein the first position and the second position are opposite positions relative to the predetermined position, and the connecting device is provided with a position-limiting feature for preventing the cable supporting member from rotation from the first position to the second position in a first direction with respect to the connecting device, and for preventing the cable supporting member from rotation from the second position to the first position in a second direction with respect to the connecting device.

14. The rack system of claim 13, wherein the object includes an upper space and a lower space, the upper space and the lower space are configured to accommodate an upper-tier article and a lower-tier article, respectively, the lower-tier article is thereby enabled to be pulled out of the lower space when the cable supporting member is at the first position, and the upper-tier article is thereby enabled to be pulled out of the upper space when the cable supporting member is at the second position.

15. The rack system of claim 12, wherein the second mechanism includes a base, the connecting portion is movably mounted on the base, and the connecting portion is connectable with any one of the connecting features when at a mounting position.

16. The rack system of claim 11, wherein the body portion of the cable supporting member includes a first wall, a second wall, and a third wall connected between the first wall and the second wall; and the first wall, the second wall, and the third wall jointly define a channel.

17. The rack system of claim 8, wherein each of the first slide rail assembly and the second slide rail assembly includes a slide rail, and each of the slide rails has a supporting portion for supporting a bottom portion of the object.

18. The rack system of claim 8, further comprising a fitting detachably mounted on a post of the rack, wherein the fitting has an extension portion extending to a position corresponding to a top portion of the object.

\* \* \* \* \*